United States Patent [19]

Nogiwa

[11] Patent Number: 5,548,402
[45] Date of Patent: Aug. 20, 1996

[54] OPTICAL SWEEP SIGNAL GENERATOR

[75] Inventor: Seiji Nogiwa, Tokyo, Japan

[73] Assignee: Ando Electric Co., Ltd., Tokyo, Japan

[21] Appl. No.: 412,990

[22] Filed: Mar. 29, 1995

[30] Foreign Application Priority Data

Mar. 31, 1994 [JP] Japan .................................. 6-085630

[51] Int. Cl.⁶ .................................................. G01B 9/02
[52] U.S. Cl. ............................ 356/349; 356/345; 372/32
[58] Field of Search ..................................... 356/345, 349, 356/350; 250/227.19, 227.27; 372/29, 32

[56] References Cited

U.S. PATENT DOCUMENTS 4,893,352 1/1990 Welford .................................. 455/610

*Primary Examiner*—Samuel A. Turner
*Attorney, Agent, or Firm*—Finnegan, Henderson, Farabow, Garrett & Dunner, L.L.P.

[57] ABSTRACT

In an optical sweep signal generator, output beams of a variable-wavelength laser are supplied to an optical branch in which they are divided into first and second beams. The first beam, branched by the optical branch, is delayed by an optical delay line, from which a delayed beam is outputted. An optical mixer mixes the second beam together with the delayed beam so as to produce a mixed beam, which is then supplied to an optical detector. The optical detector performs heterodyne wave detection on the mixed beam. Then, a frequency analyzer performs a frequency analysis on result of the heterodyne wave detection so as to detect heterodyne beat frequency. The variable-wavelength laser is controlled in such a way that the heterodyne beat frequency detected does not vary with respect to time in a selected period of time. Thus, the sweep optical frequency to be realized is varied linearly with respect to time.

3 Claims, 8 Drawing Sheets

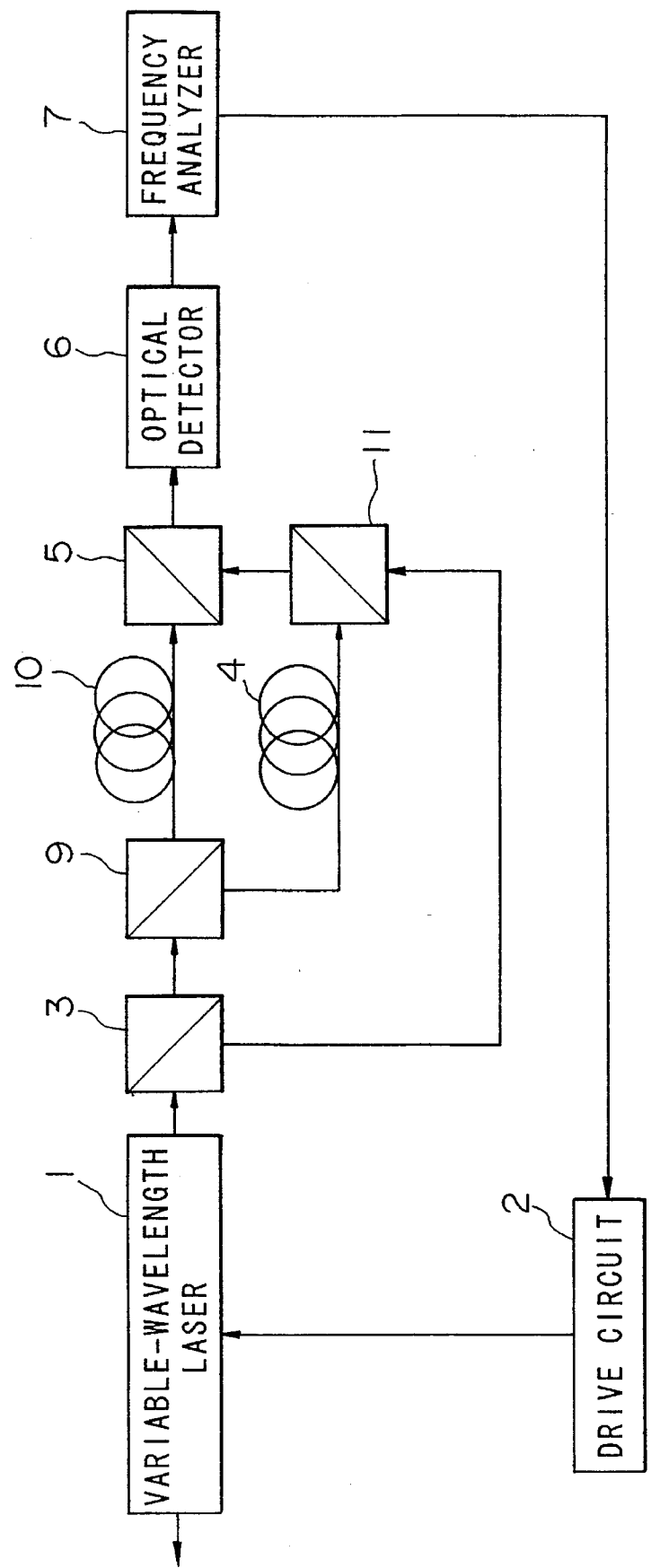

OPTICAL SWEEP SIGNAL GENERATOR

BACKGROUND OF THE INVENTION

1. Field of the Invention

The present invention relates to an optical sweep signal generator which is applicable to the fields of the optical communication, optical information processing, optical instrumentation and the like.

2. Prior Art

In the fields of the optical communication and optical instrumentation, the optical sweep signal generator is used to effect a sweep on the oscillating optical frequency of the laser or the like. And, many attempts are made to develop technology for the optical sweep signal generator.

The variable-wavelength semiconductor laser is designed to vary the oscillating optical frequency. In general, the oscillating optical frequency of the semiconductor laser has a property of non-linear variation to the electric current and voltage, which are used to control the oscillating optical frequency, as well as a property of non-linear variation to the temperature. Such properties of non-linear variation may deteriorate quality in communications or they may cause incorrectness in the optical instrumentation. In order to avoid such disadvantages, it is necessary to effect a sweep on the oscillating optical frequency in such a way that the oscillating optical frequency is varied linearly with respect to time.

In order to vary the oscillating optical frequency linearly with respect to time, it is not necessary to alter the electric current and voltage, which control the oscillating optical frequency, at a constant rate; and it is not necessary to alter the temperature at a constant rate. Instead, the conventional technology performs a so-called 'assumed control' so as to provide the oscillating optical frequency which is varied linearly with respect to time. Specifically, a relationship between the oscillating optical frequency and its control signal is examined in advance; and then, the control signal is controlled in such a way that the oscillating optical frequency is varied linearly with respect to time.

However, due to the disturbance such as the variation of temperature and due to the time-elapsed change in properties of the circuit elements of the conventional technology, the relationship between the oscillating optical frequency and its control signal should be changed. Therefore, the conventional technology suffers from a problem that the above-mentioned factors deteriorate the linearity in variation of the oscillating optical frequency with respect to time.

SUMMARY OF THE INVENTION

It is an object of the present invention to provide an optical sweep signal generator which is capable of varying the oscillating optical frequency linearly with respect to time without being affected by the disturbance and the like.

The present invention employs heterodyne wave detection which is performed on mixture of an output beam of a variable-wavelength laser and its delayed beam, so that heterodyne beat frequency is detected based on result of the heterodyne wave detection. The variable-wavelength laser is controlled in such a way that the heterodyne beat frequency detected does not vary with respect to time in a selected period of time. Thus, a sweep optical frequency, which is provided by effecting a sweep on an oscillating optical frequency of the variable-wavelength laser, is varied 11nearly with respect to time.

BRIEF DESCRIPTION OF THE DRAWINGS

These and other objects of the subject invention will become more fully apparent as the following description is read in light of the attached drawings wherein:

FIG. 8 is a block diagram showing a modified example for the optical sweep signal generator of FIG. 6.

DESCRIPTION OF THE PREFERRED EMBODIMENTS

[A] First embodiment

Figure 1:
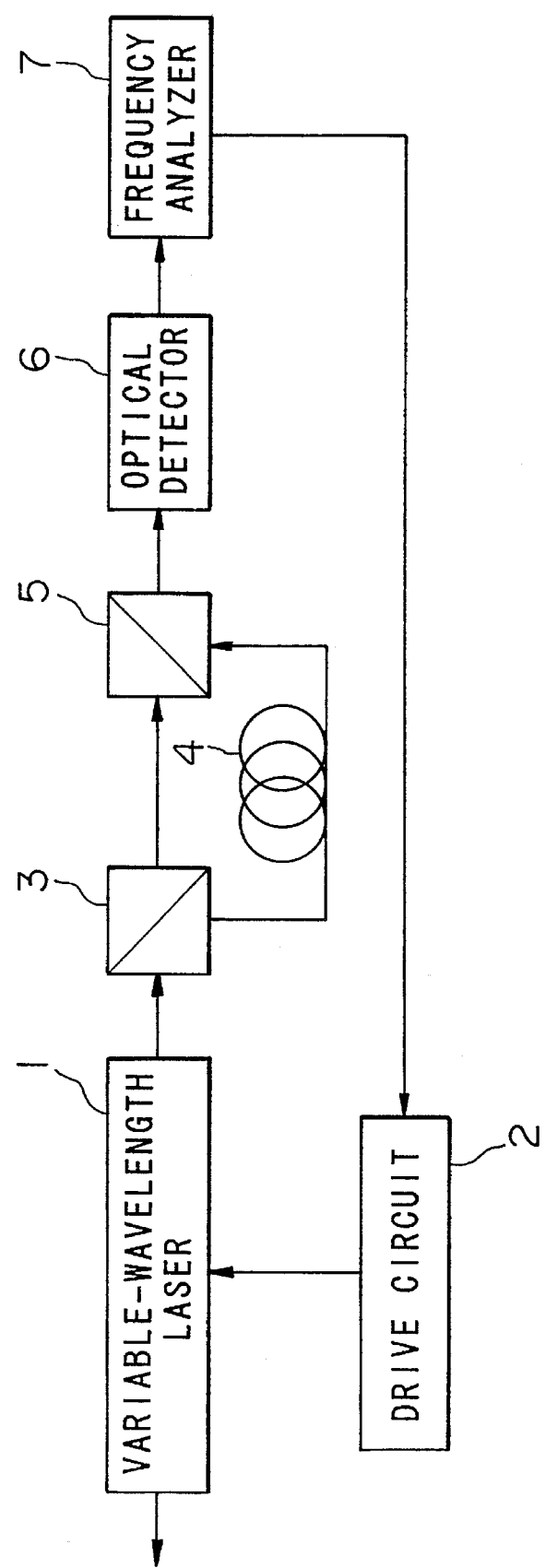
FIG. 1 is a block diagram showing an optical sweep signal generator according to a first embodiment of the present invention.

FIG. 1 is a block diagram showing a configuration of an optical sweep signal generator according to a first embodiment of the present invention. The optical sweep signal generator of FIG. 1 is configured by a variable-wavelength laser 1, a drive circuit 2, an optical branch 3, an optical delay line 4, an optical mixer 5, an optical detector 6 and a frequency analyzer 7.

The drive circuit 2 effects a sweep, having a certain period, on the oscillating optical frequency of the variable-wavelength laser 1. Output beams of the variable-wavelength laser 1 are subjected to branching by the optical branch 3. Herein, the beam, which is branched from the optical branch 3 and is transmitted onto the optical delay line 4, is called a first beam, while the beam, which is transmitted to the optical mixer 5 through the optical branch 3, is called a second beam. The first beam is delayed by the optical delay line 4, by which delayed beam is produced. Then, the optical mixer 5 mixes the second beam together with the delayed beam outputted from the optical delay line 4, so that mixed beams are created.

The optical detector 6 performs heterodyne wave-detection on the mixed beams created by the optical mixer 5. Then, the frequency analyzer 7 makes a frequency analysis on result of the heterodyne wave-detection so as to detect heterodyne beat frequency. The frequency analyzer 7 produces a control signal based on the heterodyne beat frequency detected; and then, the control signal is supplied to the drive circuit 2.

Figure 7:
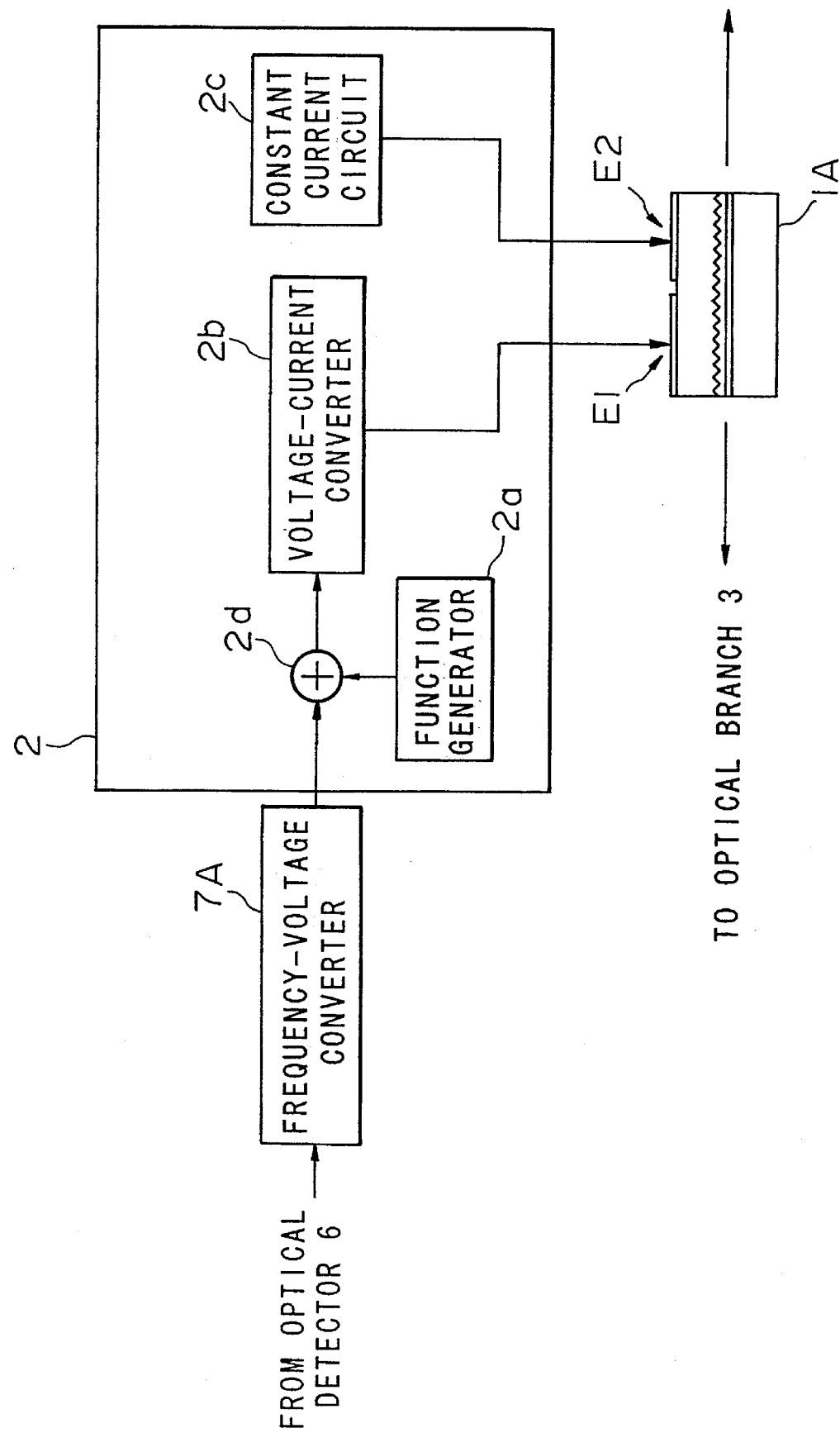
FIG. 7 is a block diagram showing a detailed configuration for an essential part of the optical sweep signal generator of FIG. 1.

FIG. 7 is a block diagram showing a detailed configuration for an essential part of the optical sweep signal generator of FIG. 1. Herein, a frequency-voltage converter 7A is used as the frequency analyzer 7; and a multi-electrode DFB laser 1A is used as the variable-wavelength laser 1. The drive circuit 2 consists of a function generator 2a, a voltage-current converter 2b, a constant current circuit 2c and an adder 2d. The heterodyne beat frequency outputted from the optical detector 6 is supplied to the frequency-voltage converter 7A in which it is converted into a "voltage signal". The function generator 2a generates a sawtooth-like voltage signal which is added to the voltage signal by the adder 2d. A result of addition is converted into an electric current (or electric currents) by the voltage-current converter 2b. The electric current is supplied to an optical-frequency-varying electrode 'E1' of the multi-electrode DFB laser 1A, while a constant current outputted from the constant current circuit 2c is supplied to a drive electrode 'E2' of the multi-electrode DFB laser 1A. Based on the constant current, supplied to the drive electrode E2, the multi-electrode DFB laser 1A performs a laser oscillation. In addition, the electric current, supplied to the optical-frequency-varying electrode E1, varies based on the sawtooth-like voltage signal given from the function generator 2a, so that a sweep is effected on the optical frequency. Further, the electric current, supplied to the optical-frequency-varying electrode E1, is controlled based on the voltage signal of the frequency-voltage converter 7A, so that a sweep on the optical frequency is varied linearly with respect to time.

Next, operations of the first embodiment shown by FIG. 1 will be described in detail with reference to graphs of FIGS. 2A and 2B.

Figure 2A:
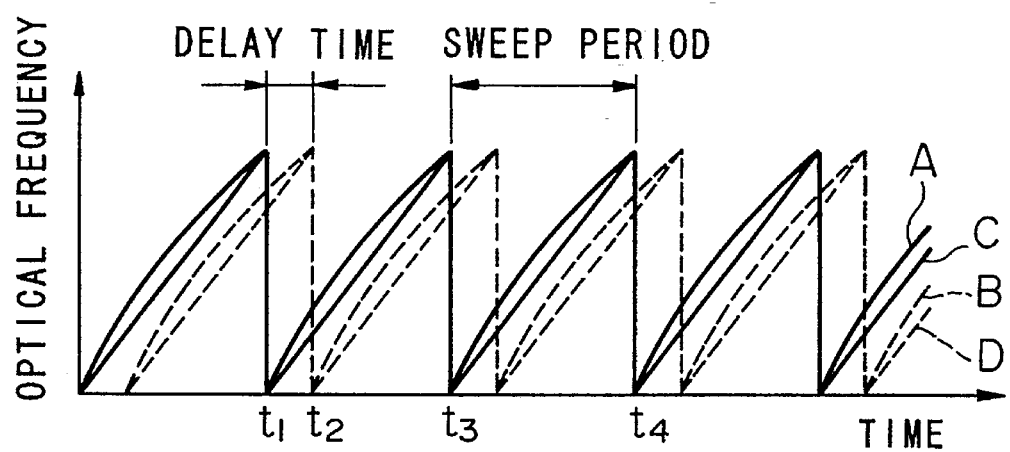
FIG. 2A is a graph showing an example of the relationship in time-elapsed variation between the oscillating optical frequency and optical frequency of the delayed beam in the first embodiment.

FIG. 2A shows a variety of waveforms A, B, C and D whose optical frequencies vary with respect to time. Herein, A and C correspond to the output beam of the variable-wavelength laser 1, while B and D correspond to the delayed beam outputted from the optical delay line 4. FIG. 2B shows time-elapsed variation of the heterodyne beat frequency, which is detected by the frequency analyzer 7.

If a sweep is effected on the oscillating optical frequency of the variable-wavelength laser 1 so that the oscillating optical frequency varies as shown by the periodic sawtooth waveform 'A' of FIG. 2A, the optical frequency of the delayed beam varies as shown by the waveform 'B'. Herein, the waveform B is delayed behind the waveform A by the delay time of the optical delay line 4. In general, the heterodyne beat frequency depends upon an absolute value corresponding to a difference between the oscillating optical frequency and optical frequency of the delayed beam. Thus, the time-elapsed variation of the heterodyne beat frequency is represented by a waveform 'Ha' of FIG. 2B.

If the oscillating optical frequency of the variable-wavelength laser 1 is varied as shown by the waveform 'C' of FIG. 2A, the optical frequency of the delayed beam is varied as shown by the waveform 'D'. Herein, as compared to the waveform 'A', the waveform 'C' is improved in linearity of the time-elapsed variation of the optical frequency. Thus, the optical frequency of the delayed beam is improved in linearity as well. Thanks to the improved linearity, variation rates in optical frequency of the waveforms C and D become identical to each other. In that case, the heterodyne beat frequency varies along a waveform 'Hb' of FIG. 2B. As compared to the waveform Ha, the waveform Hb is improved in linearity. The heterodyne beat frequency is periodically changed as shown in FIG. 2B.

At moments t1, t3 and t4 in FIG. 2A, the oscillating optical frequency, as shown by the waveforms A and C, is suddenly changed from peak frequency to bottom frequency; and the oscillating optical frequency is gradually increased from the bottom frequency to the peak frequency during a time between the moments t1 and t3. At a moment t2, the delayed beam, as shown by the waveforms B and D, is suddenly changed in optical frequency. Hence, the delay time of the optical delay line 4 exists between the moments t1 and t2 or the like. And, the time between the moments t3 and t4 or the like is called a sweep period. During a certain time, between the moments t2 and t3 or the like, in which both of the oscillating optical frequency and optical frequency of the delayed beam gradually increase at constant rate, the difference between them is constant. However, in the delay time between the moments t1 and t2 or the like, the difference between them sharply increases. Since the heterodyne beat frequency changes in proportion to the difference between the oscillating optical frequency and optical frequency of the delayed beam, the heterodyne beat frequency varies as shown by the waveforms Ha and Hb of FIG. 2B.

Figure 2B:
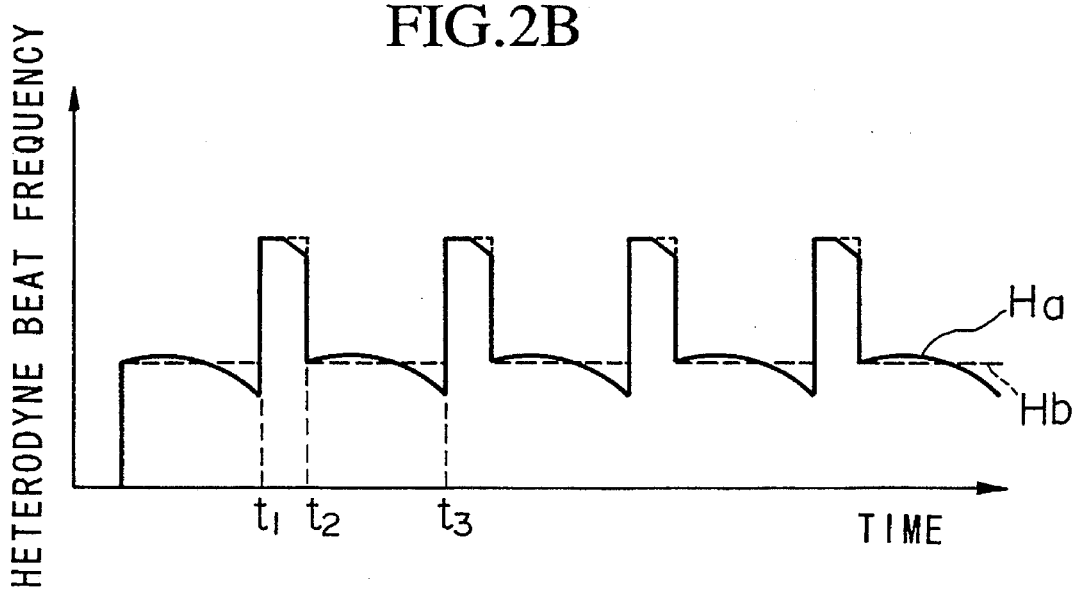
FIG. 2B is a graph showing a time-elapsed variation of heterodyne beat frequency detected by the first embodiment.
Figure 3A:
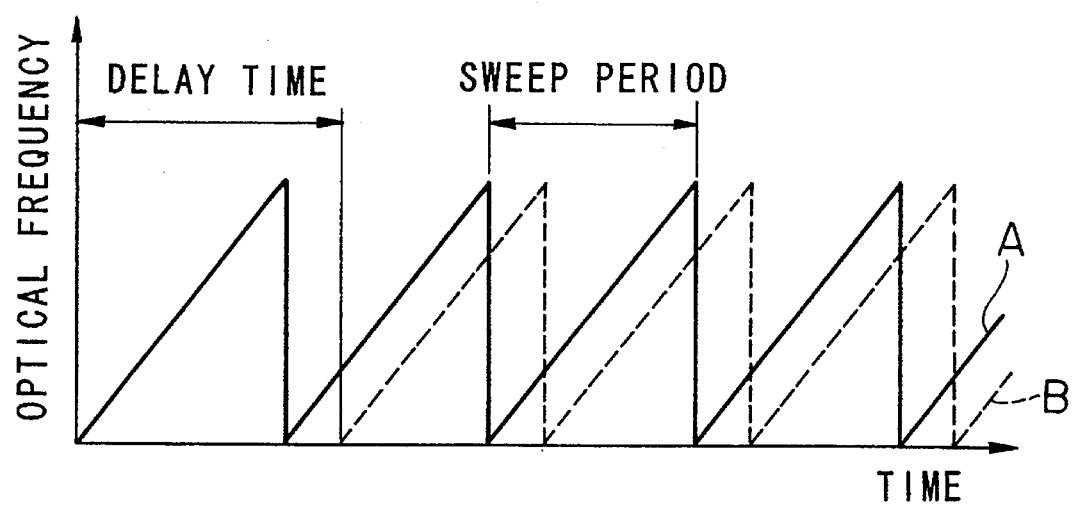
FIG. 3A is a graph showing another example of the relationship in time-elapsed variation between the oscillating optical frequency and optical frequency of the delayed beam.
Figure 3B:
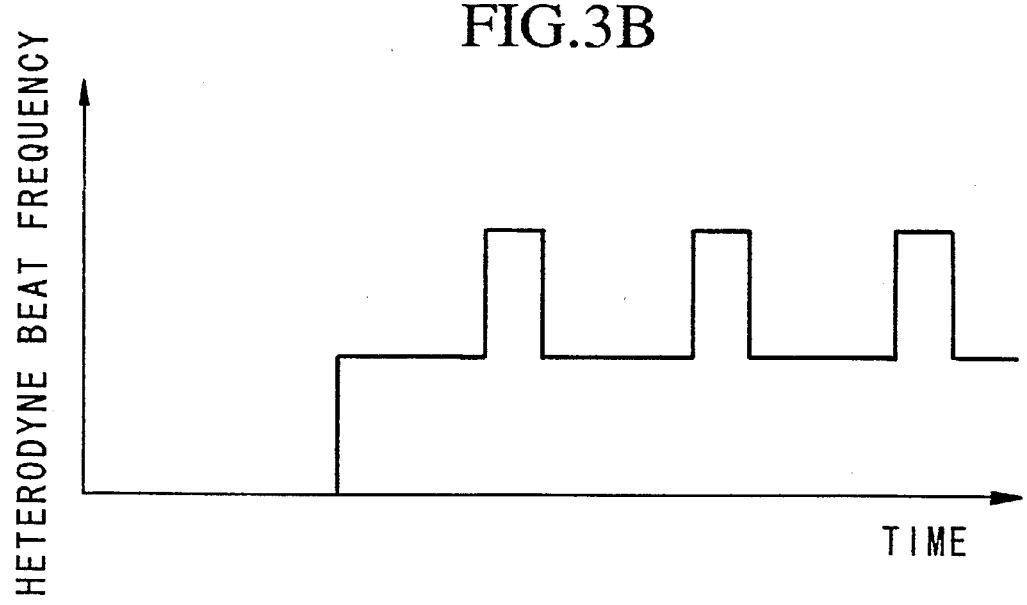
FIG. 3B is a graph showing a time-elapsed variation of heterodyne beat frequency.

If the variation of the heterodyne beat frequency, detected by the frequency analyzer 7, is represented by the waveform Ha of FIG. 2B, the control signal, which is produced based on the heterodyne beat frequency, is changed as shown by the waveform Ha. The drive circuit 2 drives the variable-wavelength laser 1 on the basis of the control signal in such a way that the heterodyne beat frequency, which is currently varied in a deflected way as shown by the waveform Ha, is modified to that as shown by the waveform Hb. In short, the variable-wavelength laser 1 is controlled by the control signal in such a way that the heterodyne beat frequency, detected by the frequency analyzer 7, is improved in linearity. Thus, the oscillating optical frequency of the variable-wavelength laser 1, which is currently represented by the 'deflected' waveform A, is changed to that as represented by the 'linear' waveform C.

In order to improve the linearity in variation of the oscillating optical frequency, it is necessary to reduce the beat frequency, which is the difference in optical frequency between the first beam branched by the optical branch 3 and the second beam passing through the optical branch 3, as small as possible. Reduction to the beat frequency can be embodied by controlling the delay time to be close to multiple times of the sweep period.

[B] Second embodiment

Figure 4:
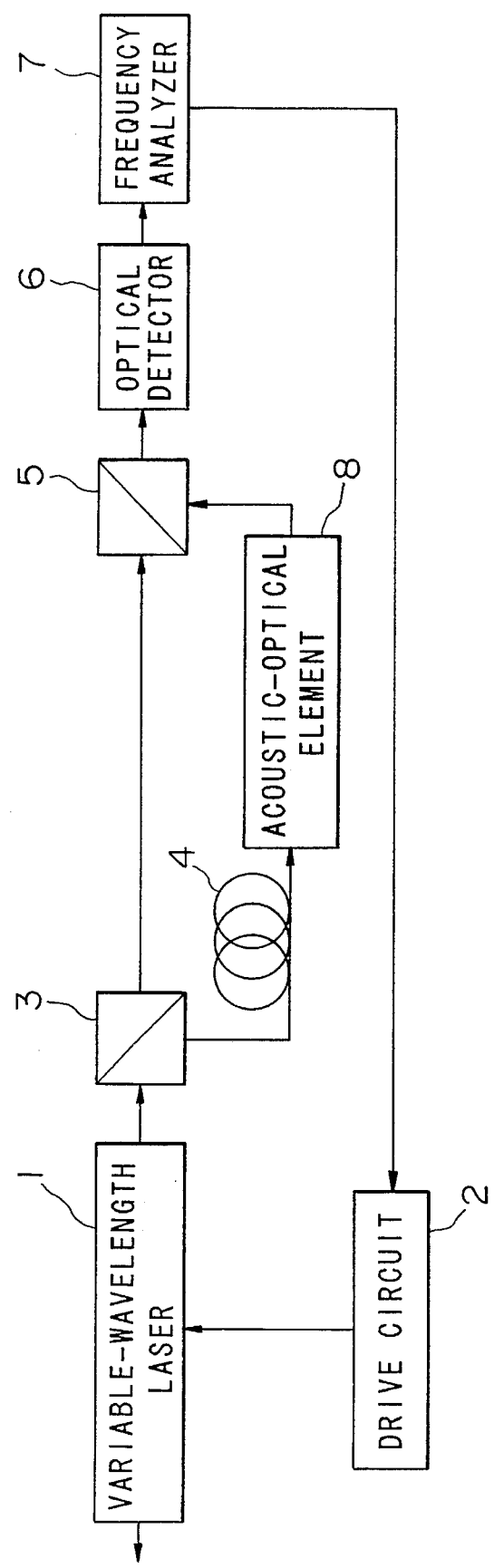
FIG. 4 is a block diagram showing an optical sweep signal generator according to a second embodiment of the present invention.

FIG. 4 is a block diagram showing an optical sweep signal generator according to a second embodiment of the present invention. As compared to the first embodiment of FIG. 1, the second embodiment of FIG. 4 is characterized by that an acoustic-optical element 8 is inserted between the optical delay line 4 and the optical mixer 5. The delayed beam, outputted from the optical delay line 4, is shifted in optical frequency by the acoustic-optical element 8 which acts based on Doppler effect, so that a shifted beam is created. Then, the shifted beam is supplied to the optical mixer 5.

Figure 5A:
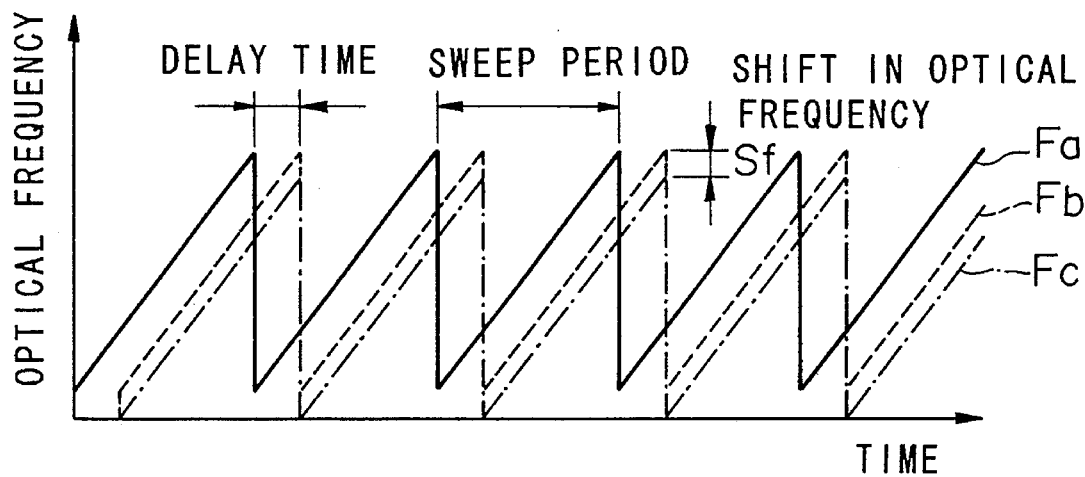
FIG. 5A is a graph showing a relationship in time-elapsed variation between the oscillating optical frequency and optical frequencies of the delayed beam and shifted beam in the second embodiment.
Figure 5B:
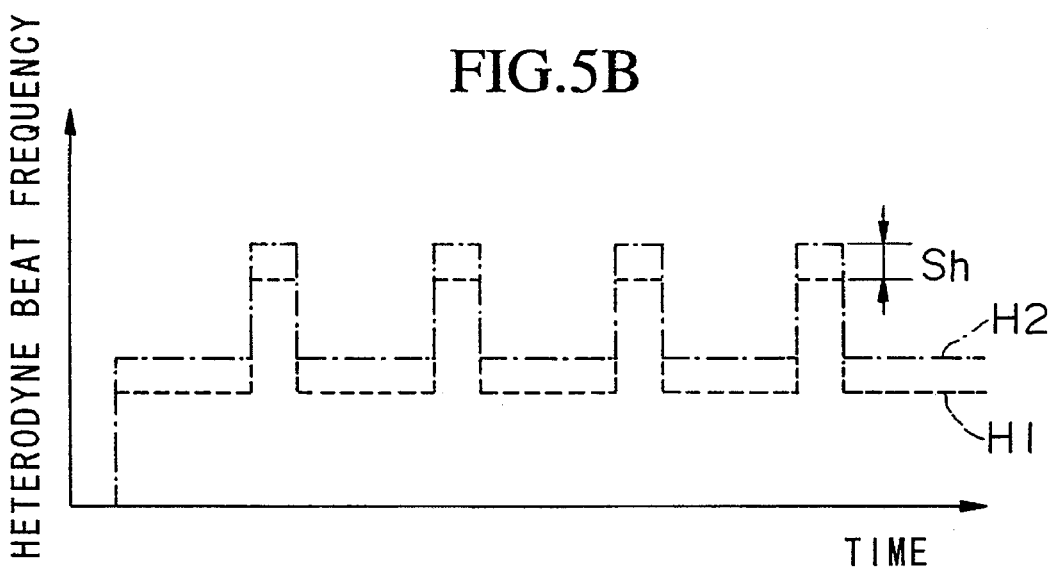
FIG. 5B is a graph showing comparison between the heterodyne beat frequencies respectively detected by the first and second embodiments.

FIG. 5A shows three kinds of waveforms, each representing a time-elapsed variation of the optical frequency, wherein 'Fa' represents the oscillating optical frequency of the variable-wavelength laser 1, 'Fb' represents the optical frequency of the delayed beam outputted from the optical delay line 4 and 'Fc' represents the optical frequency of the shifted beam outputted from the acoustic-optical element 8. As compared to the waveform Fb corresponding to the delayed beam, the waveform Fc corresponding to the shifted beam is reduced in optical frequency by 'Sf'. Further, FIG. 5B shows two kinds of waveforms, each representing a time-elapsed variation of the heterodyne beat frequency, wherein 'H1' represents the heterodyne beat frequency detected by the first embodiment and 'H2' represents the heterodyne beat frequency detected by the second embodiment. As compared to the waveform H1 of the first embodiment, the waveform H2 of the second embodiment is increased in optical frequency by 'Sh'.

In the second embodiment, the heterodyne beat frequency detected by the frequency detector 7 corresponds to the absolute value in the difference between the oscillating optical frequency (i.e., Fa) and optical frequency of the shifted beam (i.e., Fc). Because of the amount of shift 'Sf' in FIG. 5A, the difference between them is larger than that of the first embodiment. Hence, the heterodyne beat frequency of the second embodiment (i.e., H2) is larger than that of the first embodiment (i.e., H1) by the amount of shift 'Sh'. Thus, the optical sweep signal generator of the second embodiment is hardly affected by the noises. Thanks to the increased heterodyne beat frequency, the circuit elements of the second embodiment, such as the optical detector 6 and the frequency analyzer 7, are hardly affected by '1/f' noises as compared to the circuit elements of the first embodiment.

In FIG. 5, the amount of shift Sf caused by the acoustic-optical element 8 has a negative value. However, the amount of shift Sf can be set at a positive value. Because, even if the amount of shift Sf has the positive value, an absolute value in difference between the oscillating optical frequency Fa and the optical frequency Fc of the shifted beam can be set greater than the heterodyne beat frequency of the first embodiment. In that case, the amount of shift Sf of the acoustic-optical element 8 is set greater than two times of an amount of shift caused by the delay time. Therefore, the amount of shift Sf of the acoustic-optical element 8 is not necessarily set at the negative value.

In FIG. 4, the acoustic-optical element 8 is located between the optical delay line 4 and the optical mixer 5. However, the acoustic-optical element 8 can be located between the optical branch 3 and the optical delay line 4.

[C] Third embodiment

Figure 6:
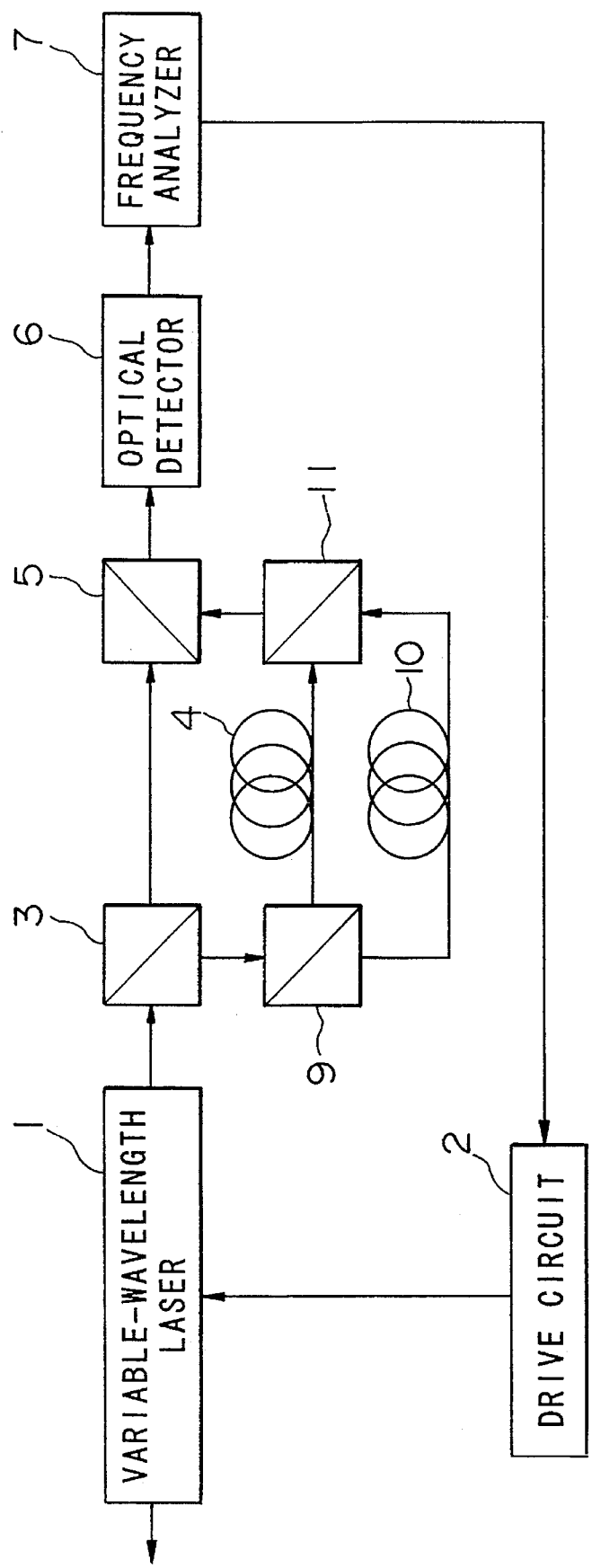
FIG. 6 is a block diagram showing an optical sweep signal generator according to a third embodiment of the present invention.

FIG. 6 is a block diagram showing an optical sweep signal generator according to a third embodiment of the present invention. As compared to the first embodiment of FIG. 1, the third embodiment of FIG. 6 is characterized by further providing an optical branch 9, an optical delay line 10 and an optical mixer 11. Herein, the beams branched by the optical branch 3 are supplied to the optical branch 9 in which they are divided into third and fourth beams. The third beam is transmitted onto the optical delay line 4 in which it is delayed; and then, the delayed third beam is supplied to the optical mixer 11. In addition, the fourth beam is transmitted onto the optical delay line 10 in which it is delayed; and then, the delayed fourth beam is supplied to the optical mixer 11. The delay time of the optical delay line 4 is set different from that of the optical delay line 10. The frequency analyzer 7 of the third embodiment can detect three kinds of heterodyne frequencies by using the oscillating optical frequency together with the optical frequencies of the delayed beams which are respectively delayed by the optical delay lines 4 and 10. In that case, the control signal to the drive circuit 2 is created in such a way that each of the three kinds of heterodyne frequencies is set constant. By providing multiple heterodyne beat frequencies, it is possible to average the noises and read-out errors of the heterodyne beat frequencies; in other words, it is possible to reduce the noises and read-out errors. Thus, the third embodiment can improve precision of detection as well as linearity of the sweep optical frequency.

Incidentally, the third embodiment of FIG. 6 can be modified as shown by FIG. 8, wherein the optical branch 9 and the optical delay line 10 are provided between the optical branch 3 and the optical mixer 5. If the number of branches provided by the optical branch 3 is increased, the optical branch 9 can be omitted. When further increasing the number of branches provided by the optical branch 3, it is possible to provide multiple optical delay lines, in parallel, each having a different optical length.

As the variable-wavelength laser 1, employed by the first, second and third embodiments, it is possible to employ the variable-wavelength-distribution-feedback-type semiconductor laser, variable-wavelength-distribution-reflection-type semiconductor laser, variable-wavelength-distribution-reflection-type semiconductor laser based on temperature control, variable-wavelength-distribution-feedback-type semiconductor laser based on temperature control, external-resonance-type semiconductor laser, rare-earth-added fiber ring laser and the like. In the embodiments, the beams of the variable-wavelength laser 1 are directly extracted for the system or device externally provided. However, it is possible to extract the beams from any point prior to the optical mixer 5 by means of the optical branch or the like.

Lastly, the configuration and arrangement of the circuit elements, which are applicable to the present invention, are not restricted by those of the embodiments described heretofore.

As this invention may be embodied in several forms without departing from the spirit of essential characteristics thereof, the embodiments are therefore illustrative and not restrictive, since the scope of the invention is defined by the appended claims rather than by the description preceeding them, and all changes that fall within meets and bounds of the claims, or equivalence of such meets and bounds are therefore intended to be embraced by the claims.

What is claimed is:

1. An optical sweep signal generator comprising:

a variable-wavelength laser for effecting a sweep, using a certain period, on oscillating optical frequency;

an optical branch for inputting output beams of the variable-wavelength laser so as to divide them into first and second beams;

an optical delay line for delaying the first beam, branched from the optical branch, to produce a delayed beam;

an optical mixer for mixing the second beam together with the delayed beam so as to produce a mixed beam;

an optical detector for performing heterodyne wave detection on the mixed beam;

a frequency analyzer for performing a frequency analysis on result of the heterodyne wave detection so as to detect heterodyne beat frequency; and control means for controlling the variable-wavelength laser in such a way that the heterodyne beat frequency detected by the frequency analyzer does not vary with respect to time in a selected period of time, whereby a sweep optical frequency to be realized is varied linearly with respect to time.

2. An optical sweep signal generator as defined in claim 1 further comprising an acoustic-optical element which is provided in connection with the optical delay line so that a difference between the oscillating optical frequency of the variable-wavelength laser and an optical frequency of the delayed beam is increased, whereby the heterodyne beat frequency is increased.

3. An optical sweep signal generator as defined in claim 1 further comprising a plurality of optical delay lines, each having a different optical length, between the optical branch and the optical mixer so that a plurality of delayed beams are realized, whereby a plurality of heterodyne beat frequencies are detected by the frequency analyzer.

* * * * *